(12) United States Patent
Nagahisa et al.

(10) Patent No.: US 8,258,544 B2
(45) Date of Patent: Sep. 4, 2012

(54) FIELD-EFFECT TRANSISTOR

(75) Inventors: Tetsuzo Nagahisa, Osaka (JP); John Kevin Twynam, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 273 days.

(21) Appl. No.: 12/728,012

(22) Filed: Mar. 19, 2010

(65) Prior Publication Data

US 2010/0308373 A1 Dec. 9, 2010

(30) Foreign Application Priority Data

Jun. 9, 2009 (JP) ................................. 2009-138083

(51) Int. Cl.
*H01L 21/00* (2006.01)

(52) U.S. Cl. .......................... 257/192; 257/194; 257/197

(58) Field of Classification Search .................. 257/192, 257/194, 197
See application file for complete search history.

(56) References Cited

U.S. PATENT DOCUMENTS

| | | | | |
|---|---|---|---|---|
| 5,049,951 A * | 9/1991 | Goronkin et al. | ................. | 257/20 |
| 5,081,511 A * | 1/1992 | Tehrani et al. | ................. | 257/192 |
| 5,170,230 A * | 12/1992 | Takikawa | ....................... | 257/195 |
| 5,473,175 A * | 12/1995 | Nikaido et al. | ................. | 257/192 |
| 5,508,554 A * | 4/1996 | Takatani et al. | ................. | 257/617 |
| 5,530,272 A * | 6/1996 | Kudo et al. | ..................... | 257/192 |
| 5,856,681 A * | 1/1999 | Ohshima | ........................... | 257/25 |
| 6,144,048 A * | 11/2000 | Suemitsu et al. | ............. | 257/192 |
| 6,207,976 B1 * | 3/2001 | Takahashi et al. | ............ | 257/192 |
| 6,351,000 B1 * | 2/2002 | Oikawa | .......................... | 257/194 |
| 6,724,019 B2 * | 4/2004 | Oda et al. | ....................... | 257/195 |
| 6,995,054 B2 * | 2/2006 | Oda et al. | ....................... | 438/197 |
| 7,291,872 B2 * | 11/2007 | Hikita et al. | ................... | 257/192 |
| 7,550,398 B2 * | 6/2009 | Tanaka et al. | ................. | 438/791 |
| 7,714,360 B2 * | 5/2010 | Otsuka et al. | ................. | 257/194 |
| 7,750,369 B2 * | 7/2010 | Ohta et al. | ..................... | 257/192 |
| 7,821,036 B2 * | 10/2010 | Ehara | .............................. | 257/195 |
| 7,859,014 B2 * | 12/2010 | Nakayama et al. | ............ | 257/192 |
| 7,859,021 B2 * | 12/2010 | Kaneko | ............................ | 257/194 |
| 7,943,496 B2 * | 5/2011 | Nomura et al. | ................ | 438/522 |
| 7,985,987 B2 * | 7/2011 | Kaneko | ............................ | 257/194 |
| 8,030,686 B2 * | 10/2011 | Ohki | .............................. | 257/192 |
| 2001/0045604 A1 * | 11/2001 | Oda et al. | ....................... | 257/350 |
| 2004/0188708 A1 * | 9/2004 | Otsuka et al. | ................. | 257/192 |
| 2005/0221628 A1 * | 10/2005 | Tanaka et al. | ................. | 438/791 |
| 2006/0060895 A1 * | 3/2006 | Hikita et al. | ................... | 257/280 |
| 2007/0051979 A1 * | 3/2007 | Kambayashi et al. | ......... | 257/194 |
| 2007/0158692 A1 * | 7/2007 | Nakayama et al. | ........... | 257/213 |
| 2007/0241419 A1 * | 10/2007 | Green et al. | ................... | 257/499 |
| 2008/0121876 A1 * | 5/2008 | Otsuka et al. | ................... | 257/40 |
| 2008/0284022 A1 * | 11/2008 | Ehara | ............................. | 257/751 |

(Continued)

FOREIGN PATENT DOCUMENTS

JP 05308082 A * 11/1993

(Continued)

*Primary Examiner* — Laura Menz (74) *Attorney, Agent, or Firm* — Birch, Stewart, Kolasch & Birch, LLP (57) ABSTRACT

A field-effect transistor provided with a substrate, a channel layer, a carrier supply layer, a source electrode, a drain electrode, a gate electrode, a first insulating layer that is laminated on the carrier supply layer between the source electrode and the drain electrode, and suppresses current collapse, an opening that is formed between an edge of the first insulating layer opposing the drain electrode and the drain electrode, and a second insulating layer that is laminated on the carrier supply layer exposed in the opening.

9 Claims, 3 Drawing Sheets

U.S. PATENT DOCUMENTS

| | | | |
|---|---|---|---|
| 2008/0315256 A1* | 12/2008 | Ohta et al. | 257/194 |
| 2009/0008677 A1* | 1/2009 | Kikkawa | 257/194 |
| 2009/0026499 A1* | 1/2009 | Kikawa et al. | 257/194 |
| 2009/0057719 A1* | 3/2009 | Takahashi et al. | 257/194 |
| 2009/0057720 A1* | 3/2009 | Kaneko | 257/194 |
| 2009/0212326 A1* | 8/2009 | Sato | 257/192 |
| 2010/0117146 A1* | 5/2010 | Ikeda et al. | 257/330 |
| 2010/0155741 A1* | 6/2010 | Ohki et al. | 257/76 |
| 2010/0155779 A1* | 6/2010 | Murase et al. | 257/192 |
| 2010/0210080 A1* | 8/2010 | Nomura et al. | 438/197 |
| 2010/0308373 A1* | 12/2010 | Nagahisa et al. | 257/192 |
| 2010/0327322 A1* | 12/2010 | Kub et al. | 257/194 |
| 2011/0062438 A1* | 3/2011 | Kaneko | 257/43 |
| 2011/0068371 A1* | 3/2011 | Oka | 257/194 |
| 2011/0272704 A1* | 11/2011 | Kikkawa | 257/76 |
| 2011/0316048 A1* | 12/2011 | Ikeda et al. | 257/192 |
| 2011/0318913 A1* | 12/2011 | Ikeda et al. | 438/585 |
| 2012/0021597 A1* | 1/2012 | Araya et al. | 438/606 |
| 2012/0028423 A1* | 2/2012 | Araya et al. | 438/191 |
| 2012/0032232 A1* | 2/2012 | Iwabuchi et al. | 257/194 |

FOREIGN PATENT DOCUMENTS

| | | | |
|---|---|---|---|
| JP | 2005286135 A | * | 10/2005 |
| JP | 2007-73555 A | | 3/2007 |
| JP | 2008-147524 A | | 6/2008 |
| JP | 2008-219054 A | | 9/2008 |
| JP | 2008-306026 A | | 12/2008 |
| JP | 2008306025 A | * | 12/2008 |
| JP | 2008306026 A | * | 12/2008 |
| JP | 2010283372 A | * | 12/2010 |
| JP | 2010287605 A | * | 12/2010 |

* cited by examiner

FIELD-EFFECT TRANSISTOR

BACKGROUND OF THE INVENTION

This application claims priority under 35 U.S.C. §119(a) on Patent Application No. 2009-138083 filed in Japan on Jun. 9, 2009, the entire contents of which are hereby incorporated by reference.

The present invention relates to a field-effect transistor provided with an insulating layer for suppressing current collapse.

Compound semiconductor devices that use compound semiconductors have been proposed. Compound semiconductors are being increasingly employed in the fields of high power and high frequency devices, given that they are physically superior in terms of electron saturation velocity, withstand voltage, thermal conductivity, and the like.

Figure 4:
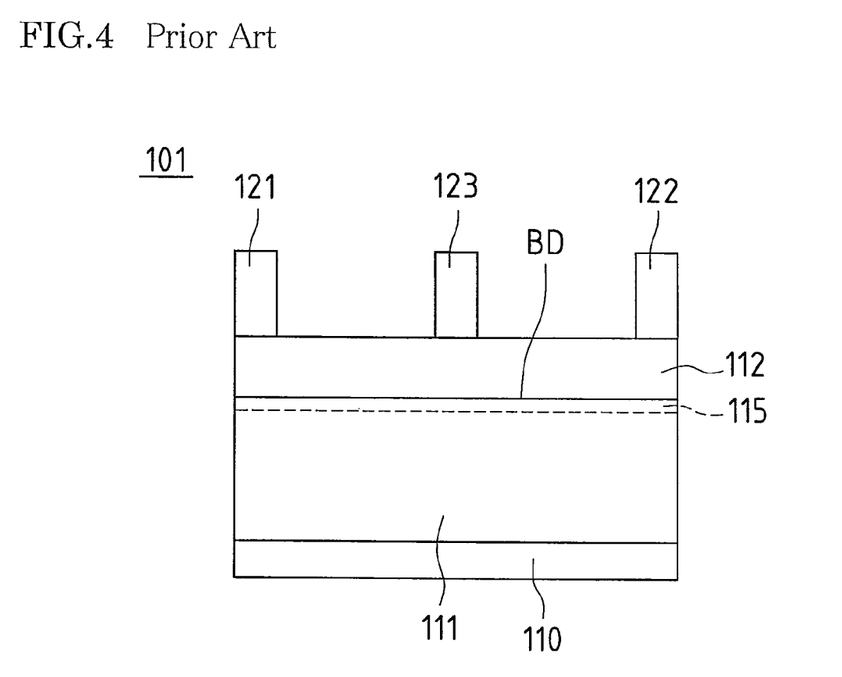
FIG. 4 is a cross-sectional view showing a cross-section of a field-effect transistor according to a Conventional Example 1.

FIG. 4 is a cross-sectional view showing a cross-section of a field-effect transistor according to a Conventional Example 1. Note that hatching of the cross-section has been omitted with consideration for easy viewing of the figure (this similarly applies to figures below).

A field-effect transistor 101 according to Conventional Example 1 is an example of a basic HFET (Heterostructure Field-Effect Transistor) structure using heterojunctions.

The field-effect transistor 101 is provided with a channel layer 111 and a carrier supply layer 112 that are sequentially laminated on a semiconductor substrate 110. Also, a source electrode 121 and a drain electrode 122 are formed as electrodes on the carrier supply layer 112, and a gate electrode 123 is formed between the source electrode 121 and the drain electrode 122. As for the material for the channel layer 111, undoped GaN is used, for example, and as for the carrier supply layer 112, n-type AlGaN is used, for example.

Electrons that become donors by being generated in the carrier supply layer 112 collect in the channel layer 111, and form a channel composed of two-dimensional electron gas called a two-dimensional electron gas layer 115, in a region on the channel layer 111 side near an interface BD between the channel layer 111 and the carrier supply layer 112. The density of the two-dimensional electron gas can be controlled by changing the thickness of a depletion layer formed directly below the gate by a field effect that occurs when a voltage is applied to the gate electrode 123. That is, the current between the source and the drain of the field-effect transistor 101 can be controlled.

Figure 5:
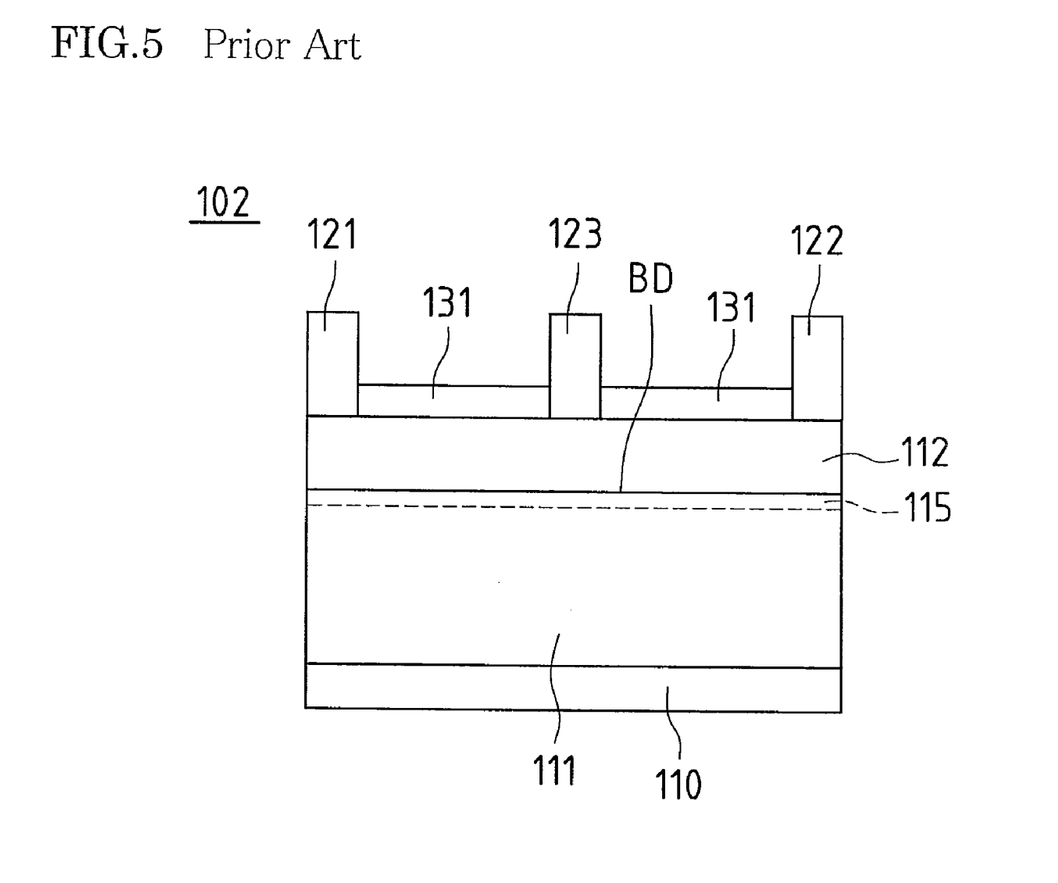
FIG. 5 is a cross-sectional view showing a cross-section of a field-effect transistor according to a Conventional Example 2.

FIG. 5 is a cross-sectional view showing a cross-section of a field-effect transistor according to a Conventional Example 2.

In recent years, various improvements to field-effect transistors have been proposed, with the field-effect transistor 102 according to Conventional Example 2 having been proposed, for example. Note that because the basic configuration is similar to the field-effect transistor 101 of Conventional Example 1, only items that differ will be principally described, with the aid of reference numerals.

The field-effect transistor 102 according to Conventional Example 2 is provided with a first insulating layer 131 on the surface of the carrier supply layer 112, in order to suppress current collapse. Note that current collapse is where the current between source and drain decreases when the field-effect transistor 102 is operated at high voltage.

The first insulating layer 131 is formed in order to decrease the occurrence of surface states in the carrier supply layer 112, thought to be the cause of current collapse. SiN is used, for example, as the material of the first insulating layer 131 (e.g., see JP 2007-73555A (Patent Document 1)).

The field-effect transistor 102 is able to suppress current collapse because of being provided with the first insulating layer 131 for suppressing the occurrence of surface states in the carrier supply layer 112. However, on the other hand, there is a problem in that an interface BD between the first insulating layer 131 and the carrier supply layer 112 tends to form a current leakage path.

Consequently, while the field-effect transistor 102 according to Conventional Example 2 is able to suppress current collapse, gate leakage current increases, making it difficult to secure sufficient withstand voltage.

As means for solving such problems, it has been proposed, for example, to form an opening in a portion of the first insulating layer 131 between the gate electrode 123 and the drain electrode 122 (e.g., see JP 2008-219054A (Patent Document 2)). That is, the field-effect transistor according to Patent Document 2 decreases the gate leakage current flowing to the interface between the first insulating layer and the carrier supply layer, using an opening formed between the gate electrode and the drain electrode.

However, there is a problem in that because the field-effect transistor according to Patent Document 2 is provided with the opening in the first insulating layer, surface states occur in the opening, leading to a decrease in current flowing between source and drain, in other words, current collapse, caused by the surface states in the opening. Moreover, while the field-effect transistor of Patent Document 2 is provided with a second insulation film formed in the opening, the occurrence of surface states cannot be prevented. That is, there is a problem in that current collapse occurs in the case where an opening is formed in the first insulating layer with the aim of decreasing gate leakage current.

The present invention has been made in consideration of such circumstances. That is, an object of the present invention is, with regard to a field-effect transistor in which an opening is formed in a first insulating layer, to provide a field-effect transistor capable of insulating an interface between the first insulating layer and a carrier supply layer from a drain electrode, and suppressing current collapse and gate leakage current, by forming the opening between an edge of the first insulating layer and the drain electrode.

SUMMARY OF THE INVENTION

A field-effect transistor according to the present invention is provided with a substrate, a channel layer that is laminated on the substrate, and through which carriers are transported, a carrier supply layer that is laminated on the channel layer, and supplies carriers to the channel layer, a source electrode that is joined to the carrier supply layer, a drain electrode that is disposed opposing the source electrode, and is joined to the carrier supply layer, a gate electrode that is disposed between the source electrode and the drain electrode, and controls transport of carriers, a first insulating layer that is laminated on the carrier supply layer between the source electrode and the drain electrode, and suppresses current collapse, an opening that is formed between an edge of the first insulating layer opposing the drain electrode and the drain electrode, and a second insulating layer that is laminated on the carrier supply layer exposed in the opening.

Consequently, the field-effect transistor according to the present invention is able to decrease gate leakage current in which the interface between the first insulating layer and the carrier supply layer forms a current leakage path, because of it being possible to insulate the interface between the first insulating layer and the carrier supply layer from the drain electrode. That is, the field-effect transistor according to the present invention is able to realize transistor properties that suppress current collapse and gate leakage current.

With the field-effect transistor according to the present invention, the second insulating layer may extend to and be laminated on the first insulating layer.

In this case, the field-effect transistor according to the present invention is provided with a first insulating layer and a second insulating layer that are readily formed, enabling the surface of the carrier supply layer to be reliably protected.

Also, with the field-effect transistor according to the present invention, the carrier supply layer may be provided with an opening ion implantation region corresponding to the opening.

In this case, because the field-effect transistor according to the present invention can increase the ion implantation amount to the opening ion implantation region compared with the density of surface states that occur in the carrier supply layer corresponding to the opening, it is possible for all surface states that occur in the carrier supply layer corresponding to the opening to capture carriers generated in the opening ion implantation region. That is, current collapse can be suppressed, by decreasing the influence of surface states that occur in the carrier supply layer corresponding to the opening, and suppressing any decrease in the carrier density of the two-dimensional electron gas layer as a result.

Also, with the field-effect transistor according to the present invention, the opening ion implantation region may be equivalent in depth to a drain ion implantation region corresponding to the drain electrode.

In this case, the field-effect transistor according to the present invention can mitigate electric field concentration that arises in the opening ion implantation region, and is able to maintain the drain withstand voltage (withstand voltage between drain and gate).

Also, with the field-effect transistor according to the present invention, the drain ion implantation region and the opening ion implantation region may extend to the channel layer.

In this case, the field-effect transistor according to the present invention enables efficient transport of carriers by suppressing on-resistance.

Also, with the field-effect transistor according to the present invention, the ion implantation amount of the opening ion implantation region may be greater than the implantation amount necessary to capture carriers in all surface states that occur in the carrier supply layer at the opening.

In this case, the field-effect transistor according to the present invention can prevent any reduction in the carrier density of the two-dimensional electron gas layer formed in the channel layer by eliminating the influence of surface states that occur in the carrier supply layer corresponding to the opening, and is able to reliably suppress current collapse.

Also, with the field-effect transistor according to the present invention, the channel layer and the carrier supply layer may be formed with a nitride compound semiconductor.

In this case, the field-effect transistor according to the present invention is able to increase both electron saturation velocity and withstand voltage. Also, the field-effect transistor according to the present invention is a highly functional device, because of being able to operate at high temperature by increasing thermal conductivity and improving heat dissipation.

Also, with the field-effect transistor according to the present invention, a forbidden band of the channel layer may be smaller than a forbidden band of the carrier supply layer.

In this case, the field-effect transistor according to the present invention is a highly functional device (heterostructure field-effect transistor) because of it being possible to form the two-dimensional electron gas layer on the carrier supply layer side of the channel layer.

Also, with the field-effect transistor according to the present invention, the first insulating layer and the second insulating layer may be silicon nitride, and a refractive index of the first insulating layer may be larger than a refractive index of the second insulating layer.

In this case, the field-effect transistor according to the present invention is able to form the first insulating layer and the second insulating layer readily and with a high degree of accuracy.

Also, with the field-effect transistor according to the present invention, a distance between the first insulating layer and the drain electrode at the opening may be from 1 μm to 2 μm.

In this case, the field-effect transistor according to the present invention can suppress any increase in field strength resulting from shortening the distance between the gate electrode and the drain electrode, and a drop in drain withstand voltage can be prevented.

DESCRIPTION OF REFERENCE NUMERALS 1 field-effect transistor
10 substrate
11 channel layer
12 carrier supply layer
15 two-dimensional electron gas layer
21 source electrode
22 drain electrode
23 gate electrode
31 first insulating layer
32 second insulating layer
40 opening
41 source ion implantation region
42 drain ion implantation region
43 opening ion implantation region
BD interface

DESCRIPTION OF THE PREFERRED EMBODIMENTS

Hereinafter, embodiments of the present invention will be described based on the drawings.

Embodiment 1

A field-effect transistor according to an Embodiment 1 of the invention will be described, based on FIG. 1 and FIG. 2.

Figure 1:
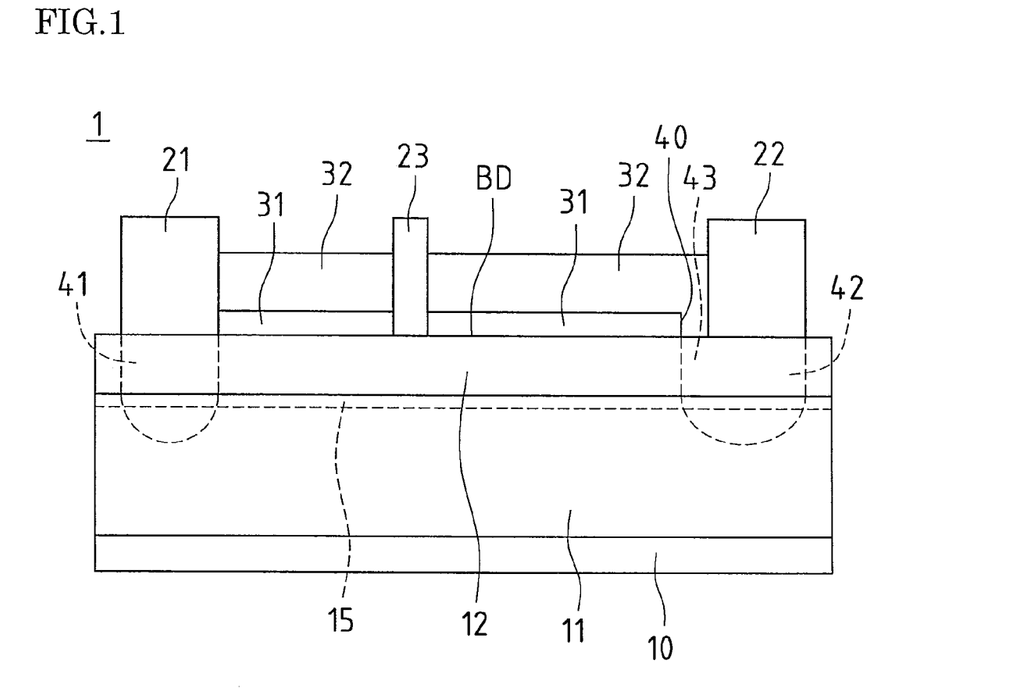
FIG. 1 is a cross-sectional view showing a cross-section of a field-effect transistor according to an Embodiment 1 of the present invention.

FIG. 1 is a cross-sectional view showing a cross-section of the field-effect transistor according to Embodiment 1. Note that hatching of the cross-section has been omitted with consideration for easy viewing of the figure (this similarly applies to figures below).

A field-effect transistor 1 according to Embodiment 1 is provided with a substrate 10, a channel layer 11 that is laminated on the substrate 10 and allows carriers to be transported, a carrier supply layer 12 that is laminated on the channel layer 11 and supplies carriers, a source electrode 21 that is joined to the carrier supply layer 12, a drain electrode 22 that is disposed opposing the source electrode 21 and is joined to the carrier supply layer 12, a gate electrode that is disposed between the source electrode 21 and the drain electrode 22, and controls transport of carriers, and a first insulating layer 31 that is laminated on the carrier supply layer 12 between the source electrode 21 and the drain electrode 22, and suppresses current collapse.

Also, the field-effect transistor 1 is provided with an opening 40 that is formed between an edge of the first insulating layer 31 opposing the drain electrode 22 and the drain electrode 22, and a second insulating layer 32 that is laminated on the carrier supply layer 12 exposed in the opening 40.

Consequently, the field-effect transistor 1 is able to decrease gate leakage current in which an interface BD between the first insulating layer 31 and the carrier supply layer 12 forms a current leakage path, because of it being possible to insulate the interface BD between the first insulating layer 31 and the carrier supply layer 12 from the drain electrode 22, by forming the opening 40 in the first insulating layer 31. That is, the field-effect transistor 1 according to Embodiment 1 is able to realize transistor properties for suppressing current collapse and gate leakage current.

The source electrode 21 and the drain electrode 22 are formed with a conductive metal, and form an Ohmic contact with the carrier supply layer 12. The gate electrode 23 is formed with a conductive metal, and forms a Schottky contact with the carrier supply layer 12 between the source electrode 21 and the drain electrode 22. The first insulating layer 31 is laminated on the carrier supply layer 12 between the source electrode 21 and the gate electrode 23. The first insulating layer 31 is laminated on the carrier supply layer 12 between the gate electrode 23 and the drain electrode 22, excluding a vicinity of the drain electrode 22.

The opening 40 for separating the sidewall of the first insulating layer 31 and the sidewall of the drain electrode 22 is formed on the carrier supply layer 12 between the gate electrode 23 and the drain electrode 22. Consequently, the interface BD between the first insulating layer 31 and the carrier supply layer 12 and the drain electrode 22 are electrically insolated.

Also, the second insulating layer 32 is embedded in the opening 40 in place of the first insulating layer 31. The second insulating layer 32 extends to and is laminated on the first insulating layer 31. Consequently, the field-effect transistor 1 according to Embodiment 1 is provided with the first insulating layer 31 and the second insulating layer 32 that are readily formed, enabling the surface of the carrier supply layer 12 to be reliably protected.

The carrier supply layer 12 is provided with an opening ion implantation region 43 corresponding to the opening 40. Consequently, because it is possible, with the field-effect transistor 1 according to Embodiment 1, to increase the amount of ions implanted into the opening ion implantation region 43 compared with the density of surface states that occur in the carrier supply layer 12 corresponding to the opening 40, it is possible for all surface states that occur in the carrier supply layer 12 corresponding to the opening 40 to capture carriers generated in the opening ion implantation region 43. Note that the opening ion implantation region 43 preferably is formed near the surface of the carrier supply layer 12 (see Embodiment 2).

That is, the field-effect transistor 1 is able to suppress current collapse, by decreasing the influence of surface states that occur in the carrier supply layer 12 corresponding to the opening 40, and suppressing any decrease in the carrier density of the two-dimensional electron gas layer 15 as a result.

Also, the carrier supply layer 12 is provided with a source ion implantation region 41 corresponding to the source electrode 21, and a drain ion implantation region 42.

The opening ion implantation region 43 is equivalent in depth to the drain ion implantation region 42 corresponding to the drain electrode 22. Consequently, the field-effect transistor 1 according to Embodiment 1 can mitigate electric field concentration that occurs in the opening ion implantation region 43, and is able to maintain drain withstand voltage (withstand voltage between drain and gate).

As described above, with the field-effect transistor 1 according to Embodiment 1, the opening ion implantation region 43 is formed to approximately the same depth as the depth of the drain ion implantation region 42, rather than only near the surface of the carrier supply layer 12.

In the case where the opening ion implantation region 43 is shallowly formed and does not reach the two-dimensional electron gas layer 15, a convex boundary will be formed at the deepest part of the edge of the opening ion implantation region 43 nearest the gate electrode 23, and there is a possibility that electric field concentration will occur.

Consequently, by making the depth of the opening ion implantation region 43 and the depth of the drain ion implantation region 42 substantially the same, and causing the opening ion implantation region 43 to reach the two-dimensional electron gas layer 15, electric field concentration that occurs in the opening ion implantation region 43 can be mitigated.

The drain ion implantation region 42 and the opening ion implantation region 43 extend to the channel layer 11. Consequently, the field-effect transistor 1 according to Embodiment 1 enables efficient transport of carriers by suppressing on-resistance.

The substrate 10 is formed with silicon (Si), for example. Note that the substrate 10 preferably is a material that is lattice-matched to a certain extent with the channel layer 11. Apart from a silicon substrate, the substrate 10 can be a sapphire substrate, a SiC substrate, or a GaN substrate, for example.

The channel layer 11 and the carrier supply layer 12 are desirably formed with a nitrate compound semiconductor. By applying a nitrate compound semiconductor (in particular, a compound semiconductor containing gallium nitrate), the field-effect transistor 1 is able to increase both electron saturation speed and withstand voltage. Also, the field-effect transistor 1 is a highly functional device, because of being able to operate at high temperature by increasing thermal conductivity and improving heat dissipation.

A forbidden band of the channel layer 11 desirably is smaller than a forbidden band of the carrier supply layer 12. As a result of this configuration, the field-effect transistor 1 according to Embodiment 1 is a highly functional device (Heterostructure Field-Effect Transistor: HFET) because of it being possible to form the two-dimensional electron gas layer 15 on the carrier supply layer 12 side of the channel layer 11.

As for the combination of materials of the channel layer 11 and the carrier supply layer 12, undoped GaN (i-GaN) can be applied as the channel layer 11, for example, and AlGaN can be applied as the carrier supply layer 12, for example. Hazardous substances will not be produced and environmental problems will not arise, given the application of GaN and AlGaN.

As a result of electrons originating from donors in the AlGaN collecting in the GaN when the GaN (channel layer 11) and AlGaN (carrier supply layer 12) contact (join), a channel composed of two-dimensional electron gas called a two-dimensional electron gas layer 15 is formed in a region on the GaN side near the boundary between the AlGaN and the GaN.

The two-dimensional electron gas layer 15 forms a channel through which electrons are transported, and serves as a transport region for electrons having a high degree of mobility. The combination of materials applied to the channel layer 11 and the carrier supply layer 12 preferably are materials that can be lattice-matched to a certain extent, and that result in a carrier supply layer 12 capable of supplying carriers to the channel layer 11.

As for the combination of the channel layer 11 and the carrier supply layer 12, apart from the combination (GaN/AlGaN) used in the present embodiment, $Al_{0.1}Ga_{0.9}N$ as the channel layer 11 and $Al_{0.3}Ga_{0.7}N$ as the carrier supply layer 12, or GaN as the channel layer 11 and AlGaInN as the carrier supply layer 12 can be combined, for instance.

Also, an appropriate buffer layer may be formed as necessary between the substrate 10 and the channel layer 11. Also, a spacer layer composed of AlN, for example, may be formed as necessary between the channel layer 11 and the carrier supply layer 12.

Also, an appropriate cap layer or a high carrier density contact layer may be laminated as necessary on the surface of the carrier supply layer 12 (interface positioned on the opposite side to the substrate 10 side, out of the interfaces with other layers).

As for the material applied to the source electrode 21 and the drain electrode 22, Ti/Al/Au can be applied, for example. As for the material applied to the source electrode 21 and the drain electrode 22, a metal material that exhibits conductivity and forms an Ohmic contact with the carrier supply layer 12 preferably is applied.

As for the material of the gate electrode 23, WN/Au can be applied, for example. As for the material applied to the gate electrode 23, a metal material that exhibits conductivity and forms a Schottky contact with the carrier supply layer 12 preferably is applied.

As for the material of the first insulating layer 31, it is possible to apply silicon nitride SiN with a refractive index of 2.0 or more, for example. Current collapse is, as abovementioned, a phenomenon in which the current between source and drain decreases when the transistor is operated at high voltage. As for the cause of current collapse, it is thought that surface states occur near the surface of the carrier supply layer 12, and that the carrier density of the two-dimensional electron gas layer 15 is relatively reduced, based on the charge of carriers captured in the surface states that occur.

That is, it is thought that the cause of current collapse is a decrease in current between source and drain, due to a reduction in the carrier density of the two-dimensional electron gas layer 15, based on the charge of carriers captured in surface states.

The occurrence of surface states in the carrier supply layer 12 can be decreased by laminating the first insulating layer 31 on the carrier supply layer 12. Consequently, because the capturing of carriers caused by surface states is reduced, it is possible to prevent any decrease in current between source and drain, and current collapse can be suppressed as a result.

The first insulating layer 31 is also sometimes commonly called a passivation film, or simply a protective film. Note that this layer preferably exhibits the action of suppressing current collapse, and can also be called a collapse suppressing layer. As for the material applied to the first insulating layer 31, an insulating material that has the effect of suppressing current collapse, and can maintain adhesion with the carrier supply layer 12 preferably is applied.

The opening 40 can be formed by patterning a resist on a region corresponding to the opening 40, laminating (depositing) the first insulating layer 31 between the source electrode 21 and the drain electrode 22, and then lifting off the first insulating layer 31 laminated on the opening 40 by removing the resist. Alternatively, it is also possible to form the opening 40 by laminating (depositing) the first insulating layer 31 between the source electrode 21 and the drain electrode 22, and then selectively removing the first insulating layer 31 laminated on the opening 40 by etching with the patterned resist as a mask.

The distance between the first insulating layer 31 and the drain electrode 22 at the opening 40 desirably is from 1 μm to 2 μm. As a result of this configuration, the field-effect transistor 1 according to Embodiment 1 can suppress any increase in field strength resulting from shortening the distance between the gate electrode 23 and the drain electrode 22, and is able to prevent a drop in drain withstand voltage.

That is, the sidewall of the first insulating layer 31 and the sidewall of the drain electrode 22 preferably are separated by a distance that enables insulation between the interface BD and the drain electrode 22 to be maintained. However, when the distance between the first insulating layer 31 and the drain electrode 22 increases, withstand voltage could drop, since the substantive distance between the gate electrode 23 and the drain electrode 22 decreases and the field strength between the gate electrode 23 and the drain electrode 22 increases, given that the edge of the opening ion implantation region 43 (the edge nearest the gate electrode 23) corresponding to the opening 40 approaches the gate electrode 23.

Consequently, the distance between the first insulating layer 31 and the drain electrode 22 desirably is kept from 1 μm to 2 μm. Note that, as described above, this distance can be appropriately set with consideration for the influence on withstand voltage, and is not intended to be limited to this range.

As for the material of the second insulating layer 32, it is possible to apply silicon nitride SiN with a refractive index of approximately 1.7, for example. That is, the first insulating layer 31 and the second insulating layer 32 desirably are silicon nitride, and the refractive index of the first insulating layer 31 desirably is greater than the refractive index of the second insulating layer 32. As a result of this configuration, the field-effect transistor 1 according to Embodiment 1 is able to form the first insulating layer 31 and the second insulating layer 32 readily and with a high degree of accuracy.

That is, the first insulating layer 31 and the second insulating layer 32 can be readily formed, given that they are silicon nitride with different refractive indexes. Also, because the formation temperature of silicon nitride having a small refractive index can be set to a low temperature, relative to the formation temperature of silicon nitride having a large refractive index, the first insulating layer 31 and the second insulating layer 32 are able to maintain a stable film quality.

Note that the material of the second insulating layer 32 preferably is a material having insulation properties with respect to the source electrode 21, the gate electrode 23, and the drain electrode 22. Consequently, apart from SiN, which is applied in the present embodiment, $SiO_2$, $Al_2O_3$, HfOx or AlN can be applied, for example.

The source ion implantation region 41 preferably enables electrical continuity to be established between the source electrode 21 and the two-dimensional electron gas layer 15. Also, the drain ion implantation region 42 preferably enables electrical continuity to be established between the drain electrode 22 and the two-dimensional electron gas layer 15. The on-resistance of the field-effect transistor 1 can be reduced by the source ion implantation region 41 and the drain ion implantation region 42. The amount of ions implanted into the source ion implantation region 41 and the drain ion implantation region 42 is approximately $10^{15}/cm^2$. As for the ions that are implanted, Si can be applied, for example.

The ion implantation amount of the opening ion implantation region 43 desirably is greater than the implantation amount necessary to capture carriers in all surface states that occur in the carrier supply layer 12 at the opening 40. As a result of this configuration, the field-effect transistor 1 according to Embodiment 1 can prevent any reduction in the carrier density of the two-dimensional electron gas layer 15 formed in the channel layer 11 by eliminating the influence of surface states that occur in the carrier supply layer 12 corresponding to the opening 40, and is able to reliably suppress current collapse.

Hereinafter, the reason for the abovementioned requirements will be further described in detail.

Current collapse is, as abovementioned, a phenomenon caused by states (surface states) occurring near the surface of the carrier supply layer 12. The density of surface states that actually occur near the surface of the carrier supply layer 12 is considered to be approximately $10^{12}/cm^2$.

Consequently, by capturing carriers generated in the opening ion implantation region 43 in all surface states that occur in the carrier supply layer 12, the influence of surface states occurring in the carrier supply layer 12 on the carrier density of the two-dimensional electron gas layer 15 formed in the channel layer 11 can be eliminated.

That is, with Embodiment 1, it is possible to eliminate the influence of surface states, given that carriers generated in the opening ion implantation region 43 are captured in all surface states that occur in the carrier supply layer 12 corresponding to the opening 40, and, as a result, to prevent any reduction in the carrier density of the two-dimensional electron gas layer 15, and to suppress current collapse.

In Embodiment 1, the ion implantation amount actually implanted into the source ion implantation region 41 and the drain ion implantation region 42 is, as abovementioned, approximately $10^{15}/cm^2$, for example. Consequently, by similarly forming the opening ion implantation region 43 in conjunction when forming the source ion implantation region 41 and the drain ion implantation region 42, ions of approximately $10^{15}/cm^2$ can also be implanted into the opening ion implantation region 43.

Consequently, it is possible to generate carriers of $10^{15}/cm^2$ in the opening ion implantation region 43, whereas the surface state density will be $10^{12}/cm^2$ in the carrier supply layer 12, and generated carriers can be captured in all surface states of the carrier supply layer 12.

Note that while the opening ion implantation region 43 is conductive, there is a band gap difference (difference in forbidden bands) between the first insulating layer 31 and the carrier supply layer 12. Consequently, the insulation properties can be maintained, because flow of carriers does not occur between the opening ion implantation region 43 and the interface BD with the first insulating layer 31 and the carrier supply layer 12.

Figure 2:
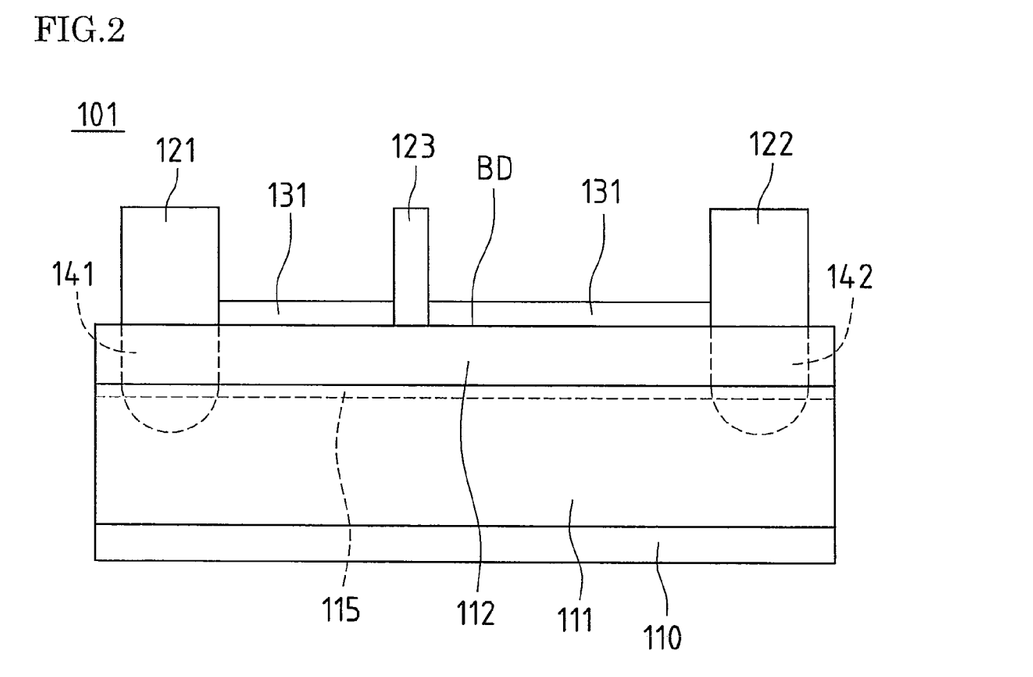
FIG. 2 is a cross-sectional view showing a cross-section of a conventional field-effect transistor shown for comparison with Embodiment 1 of the present invention.

FIG. 2 is a cross-sectional view showing a cross-section of a conventional field-effect transistor shown for comparison with Embodiment 1.

A conventional field-effect transistor 101 (HFET) is provided with a substrate 110, a channel layer 111 laminated on the substrate 110, and a carrier supply layer 112 laminated on the channel layer 111. Also, a source electrode 121 and a drain electrode 122 form an Ohmic contact with the carrier supply layer 112, and a gate electrode 123 formed with a conductive metal forms a Schottky contact with the carrier supply layer 112 between the source electrode 121 and the drain electrode 122.

A first insulating layer 131 is laminated on the carrier supply layer 112 between the source electrode 121 and the gate electrode 123 and between the gate electrode 123 and the drain electrode 122. Also, a source ion implantation region 141 is formed in the carrier supply layer 112 corresponding to the source electrode 121, and a drain ion implantation region 142 is formed in the carrier supply layer 112 corresponding to the drain electrode 122. Also, the source ion implantation region 141 and the drain ion implantation region 142 extend so as to reach the channel layer 111. A two-dimensional electron gas layer 115 is formed at the boundary of the channel layer 111 with the carrier supply layer 112, enabling carriers to be transported.

With the conventional field-effect transistor 101, the interface BD between the first insulating layer 131 and the carrier supply layer 112 could form a current leakage path. That is, leakage current in which the interface BD forms a current leakage path tends to occurs, given that the first insulating layer 131 is formed over the entire surface of the carrier supply layer 112, which is respectively positioned between the source electrode 121, the gate electrode 123 and the drain electrode 122.

In terms of actual usage, gate leakage current, in particular, is a problem, because a potential difference of several hundred volts, for example, exists between gate and drain. Note that gate leakage current here refers to leakage current that flows between the gate electrode 123 and the drain electrode 122 when power is turned off.

In order to decrease gate leakage current with the structure of the field-effect transistor 101, a method that involves blocking the leakage path between the gate electrode 123 and the drain electrode 122, by forming an opening in the first insulating layer 131 between the gate electrode 123 and the drain electrode 122, and blocking the interface BD is conceivable (see Patent Document 2). However, surface states occur in the carrier supply layer 112, given that the first insulating layer 131 does not exist in the opening, causing current collapse to occur.

In contrast to the conventional field-effect transistor 101, the field-effect transistor 1 according to Embodiment 1 is, as abovementioned, provided with an opening 40 that is formed between the edge of the first insulating layer 31 opposing the drain electrode 22 and the drain electrode 22, and a second insulating layer 32 that is laminated on the carrier supply layer 12 exposed in the opening 40. Also, the carrier supply layer 12 is provided with an opening ion implantation region 43 corresponding to the opening 40.

Consequently the field-effect transistor 1 can easily and reliably resolve the problems that arose with the conventional field-effect transistor 101.

Note that because film formation of the channel layer 11, film formation of the carrier supply layer 12, film formation of the first insulating layer 31, film formation of the second insulating layer 32, formation of the source electrode 21, formation of the drain electrode 22, formation of the gate electrode 23, formation of the opening 40, formation of the source ion implantation region 41, formation of the drain ion implantation region 42, and formation of the opening ion implantation region 43 can be performed by applying known techniques, details of the film formation methods and the formation methods (electrode formation methods, ion implantation methods, patterning methods) will be omitted.

Embodiment 2

A field-effect transistor according to Embodiment 2 of the present invention will be described, based on FIG. 3.

Figure 3:
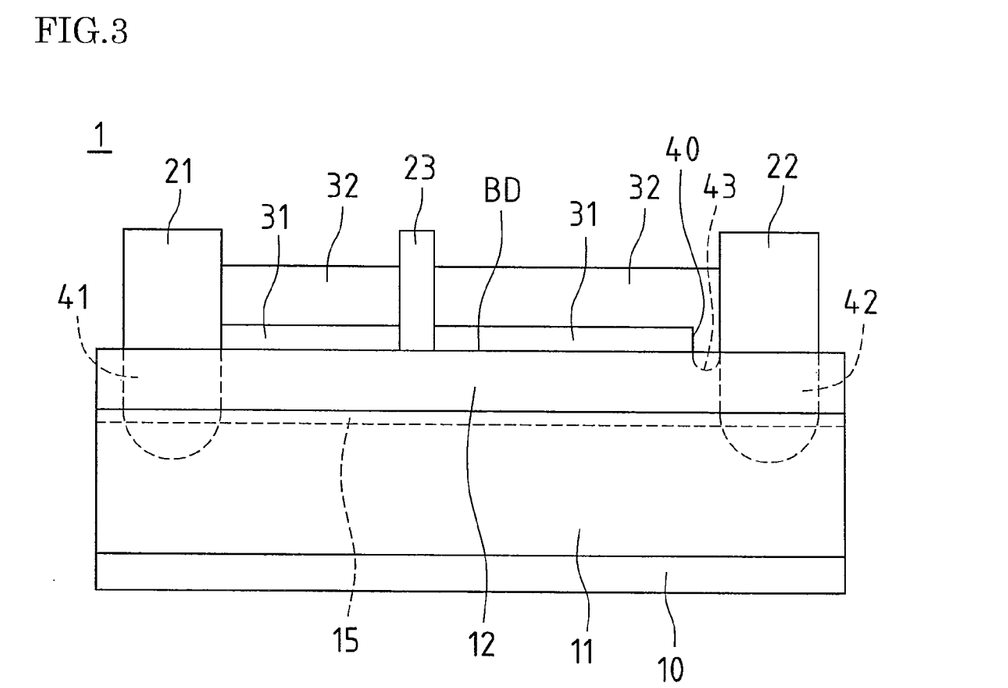
FIG. 3 is a cross-sectional view showing a cross-section of a field-effect transistor according to an Embodiment 2 of the present invention.

FIG. 3 is a cross-sectional view showing a cross-section of the field-effect transistor according to Embodiment 2 of the present invention.

Because the basic configuration of the field-effect transistor 1 according to Embodiment 2 is similar to the configuration of the field-effect transistor 1 according to Embodiment 1, items that differ will be principally described, with the aid of reference numerals.

In Embodiment 1, the opening ion implantation region 43 was formed to approximately the same depth as the drain ion implantation region 42, but in Embodiment 2, the opening ion implantation region 43 is only formed near the surface of the carrier supply layer 12.

As abovementioned, surface states of the carrier supply layer 12 corresponding to the opening 40 occur near the surface of the carrier supply layer 12. Consequently, in order to prevent the influence of surface states and suppress current collapse, the opening ion implantation region 43 preferably is at least formed near the surface of the carrier supply layer 12, in a region corresponding to the opening 40.

Note that while the gate electrode 23 and the carrier supply layer 12 constituted a Schottky contact in Embodiment 1 and Embodiment 2, a so-called MIS (metal-insulator-semiconductor) structure in which an insulating layer for insulating the gate electrode 23 from the carrier supply layer 12 can also be provided, in which case similar effects are achieved.

Hereinabove, embodiments of the present invention have been described, although it should be appreciated that the present invention is not limited to the abovementioned embodiments, and that various modifications are possible within the scope defined by the claims. Also, embodiments that can be realized by appropriately combining technical means respectively disclosed in the different embodiments are encompassed in the technical scope of the present invention.

What is claimed is:

1. A field-effect transistor comprising:
   a substrate;
   a channel layer that is laminated on the substrate, and through which carriers are transported;
   a carrier supply layer that is laminated on the channel layer, and supplies carriers to the channel layer;
   a source electrode that is joined to the carrier supply layer;
   a drain electrode that is disposed opposing the source electrode, and is joined to the carrier supply layer;
   a gate electrode that is disposed between the source electrode and the drain electrode, and controls transport of carriers;
   a first insulating layer that is laminated on the carrier supply layer between the source electrode and the drain electrode, and suppresses current collapse;
   an opening that is formed between an edge of the first insulating layer opposing the drain electrode and the drain electrode; and
   a second insulating layer that is laminated on the carrier supply layer exposed in the opening,
   wherein the carries supply layer is provided with an opening ion implantation region corresponding to the opening.

2. The field-effect transistor according to claim 1, wherein the second insulating layer extends to and is laminated on the first insulating layer.

3. The field-effect transistor according to claim 1, wherein the opening ion implantation region is equivalent in depth to a drain ion implantation region corresponding to the drain electrode.

4. The field-effect transistor according to claim 3, wherein the drain ion implantation region and the opening ion implantation region extend to the channel layer.

5. The field-effect transistor according to claim 1, wherein an ion implantation amount of the opening ion implantation region is greater than an implantation amount necessary to capture carriers in all surface states that occur in the carrier supply layer at the opening.

6. The field-effect transistor according to claim 1, wherein the channel layer and the carrier supply layer are formed with a nitride compound semiconductor.

7. The field-effect transistor according to claim 6, wherein a forbidden band of the channel layer is smaller than a forbidden band of the carrier supply layer.

8. The field-effect transistor according to claim 1, wherein the first insulating layer and the second insulating layer are silicon nitride, and a refractive index of the first insulating layer is larger than a refractive index of the second insulating layer.

9. The field-effect transistor according to claim 1, wherein a distance between the first insulating layer and the drain electrode at the opening is from 1 µm to 2 µm.

* * * * *